(12) United States Patent
Hergenhan et al.

(10) Patent No.: US 7,218,651 B2
(45) Date of Patent: May 15, 2007

(54) ARRANGEMENT FOR THE GENERATION OF A PULSED LASER BEAM OF HIGH AVERAGE OUTPUT

(75) Inventors: Guido Hergenhan, Jena (DE); Christian Ziener, Jena (DE); Kai Gaebel, Jena (DE)

(73) Assignee: Xtreme technologies GmbH, Jena (DE)

( * ) Notice: Subject to any disclaimer, the term of this patent is extended or adjusted under 35 U.S.C. 154(b) by 0 days.

(21) Appl. No.: 11/293,417

(22) Filed: Dec. 2, 2005

(65) Prior Publication Data
US 2006/0140232 A1    Jun. 29, 2006

(30) Foreign Application Priority Data
Dec. 29, 2004  (DE)  ............... 10 2004 063 832

(51) Int. Cl.
*H01S 3/121* (2006.01)
*H01S 3/10* (2006.01)
(52) U.S. Cl. ............. 372/15; 372/24; 372/25
(58) Field of Classification Search .......... 372/15
See application file for complete search history.

(56) References Cited

U.S. PATENT DOCUMENTS 4,800,179 A * 1/1989 Mukai ............ 438/632
5,818,546 A  10/1998 Opower et al.

FOREIGN PATENT DOCUMENTS

| DE | 199 35 404 | 2/2001 |
| JP | 09-288243 | * 11/1997 |
| WO | WO 03/084014 | 10/2003 |
| WO | WO 2005/081372 | 9/2005 |

OTHER PUBLICATIONS

Patent Abstracts of Japan, Publication No. 09-288243 / published on Nov. 4, 1997 "Optical Multiplexing Device and Optical Output Device" Sony Corp. (Appln No. 08-123931 / Apr. 23, 1996).

* cited by examiner

*Primary Examiner*—Armando Rodriguez
(74) *Attorney, Agent, or Firm*—Reed Smith LLP

(57) ABSTRACT

The invention is directed to an arrangement for generating a pulsed laser beam with high average output, in particular for generating a hot plasma which emits extreme ultraviolet (EUV) radiation. It is the object of the invention to find a novel possibility for generating a laser beam with a high repetition rate and average output which allows the repetition frequency and, therefore, the output of the laser system to be increased by connecting together a plurality of individual lasers having limited repetition rate without degradation of the beam quality on the target compared to that of an individual laser. This object is met, according to the invention, in that an oriented mirror surface is associated with each individual laser in such a way that a beam bundle which is emitted by each individual laser so as to be offset with respect to time and which is reflected at the mirror surface is coupled into a common beam path, and laser pulses in the common beam path are directed to a target one after the other in a regular, defined pulse sequence, and, with a continuously dynamic mirror movement for coupling the laser pulses into the common beam path, optical means are provided in the common beam path for compensating the directional change caused by the mirror movement.

16 Claims, 5 Drawing Sheets

ARRANGEMENT FOR THE GENERATION OF A PULSED LASER BEAM OF HIGH AVERAGE OUTPUT

CROSS-REFERENCE TO RELATED APPLICATIONS

This application claims priority of German Application No. 10 2004 063 832.2, filed Dec. 29, 2004, the complete disclosure of which is hereby incorporated by reference.

BACKGROUND OF THE INVENTION a) Field of the Invention

The invention is directed to an arrangement for generating a pulsed laser beam of high average output, particularly for generating a hot plasma which emits extreme ultraviolet (EUV) radiation.

b) Description of the Related Art

Pulsed lasers with a high average output and good beam quality are needed for certain applications such as a pumped light source of a laser-induced plasma for the generation of EUV radiation. The high average output is achieved with short pulse lengths by high repetition rates in the kilohertz range.

However, some laser types such as TEA-$CO_2$ lasers, excimer lasers and also some Nd-YAG lasers with elements for phase conjugation which deliver pulsed radiation have a limited repetition frequency. For example, the maximum repetition frequency of a TEA-$CO_2$ laser is typically 250 Hz with a pulse length of only 100 ns and a pulse energy between 1 J and 20 J per individual laser.

In the prior art, DE 199 35 404 A1 discloses an illumination system for wavelengths of less than 193 nm, particularly for EUV lithography, which has a plurality of light sources and a mirror arrangement for generating secondary light sources with a plurality of mirrors which are divided into raster elements. The aim here is to illuminate the exit pupil of the illumination system by a plurality of light sources as homogeneously as possible up to a determined filling degree. For this purpose, a honeycomb plate is provided with a plurality of pyramids for joining the partial light source pupils together in an additive (non-overlapping) manner or for mixing the light of the partial light sources illuminating the exit pupil. In this way, it is only possible to achieve a local increase in the geometric flux (etendue) in the exit pupil of the total system with a considerable expenditure on optical alignment. Pulse excitation with increased frequency is not described.

Further, U.S. Pat. No. 5,818,546 is cited as non-generic prior art, wherein a device is disclosed for generation of an image in an image surface. Using projection optics, a radiation source generates an image in that at least one image series is formed by illuminating adjacent image spots during an image forming cycle and the image forming cycle is constantly repeated. Image generation is carried out by a succession of semiconductor emitters that are imaged on metrically organized image spots of the image surface by a polygonal mirror system and/or tilting mirror system. The intensity of the individual semiconductor emitters is controllable in order to display different contents for image generation in the human eye. An exact synchronization with the position of the mirror surfaces is provided by the pulsed control of the semiconductor emitters. Blurring effects of the image points caused by a slight movement of the mirror surfaces during the controlling of the light emitters are wanted and, therefore, no measures are undertaken to suppress them.

OBJECT AND SUMMARY OF THE INVENTION

It is the primary object of the invention to find a novel possibility for generating a laser beam with a high repetition rate and high average output which allows the repetition frequency and, therefore, the output of a laser system to be increased by connecting together a plurality of lasers having limited repetition rate without degradation of the beam quality (stability of intensity and spatial stability) of the laser system on the target compared to that of an individual laser.

In an arrangement for generating a pulsed laser beam with high average output, in particular for generating a hot plasma which emits extreme ultraviolet (EUV) radiation, wherein a quantity of light sources are associated with variously oriented mirror surfaces in order to achieve defined secondary light source images, the above-stated object is met according to the invention in that an oriented mirror surface is associated with each light source in such a way that a light bundle that is emitted by each of the light sources so as to be offset with respect to time is coupled into a common beam path at the correspondingly oriented mirror surface as a reflected beam bundle, in that the light sources are individual lasers that are operated in pulsed mode and are triggered differently, wherein laser pulses of all individual lasers in the common beam path are directed to a target one after the other in a regular, defined pulse sequence, and in that a continuously dynamic mirror movement for orienting the mirror surface is provided for coupling the laser pulses of the individual lasers into the common beam path, wherein optical means are provided in the common beam path for compensating a change in angle of the beam bundles for the duration of each individual laser pulse in order to achieve a temporally and spatially constant beam quality on the target for the duration of every laser pulse.

The individual lasers are advantageously arranged in such a way that the emitted laser beams of the individual lasers intersect at a point in which the mirror surface with variable angular position is located in order to deflect every laser beam into the common beam path.

The mirror surface that is associated with every individual laser is advisably arranged at a rotating facet mirror, wherein exactly one mirror facet with adapted angular position is directed toward each of the individual lasers when the latter emit successive laser pulses. In a preferred variant, at least two different mirror facets with adapted angular position are alternately directed toward each individual laser.

In another construction, the mirror surface associated with each individual laser can be an individual mirror surface of a rotating mirror, each individual mirror surface being directed in a suitably adjusted manner toward the individual laser that is activated for the laser pulse.

The individual lasers are preferably arranged in a plane around the point of intersection of their emitted laser beams. The pulse length of each individual laser is advisably substantially shorter than the time between two successive pulses of different individual lasers, wherein the fewer facets available to each individual laser as associated mirror surfaces, i.e., the higher the rotating speed of the mirror surface(s), the shorter the pulse length.

The individual lasers are advantageously TEA-$CO_2$ lasers, excimer lasers, pulsed solid state lasers, or any combination thereof.

A telescopic system is preferably provided in the common beam path for compensating the directional change of the reflected beam bundles during a laser pulse. The point of intersection of all of the laser beams of the individual lasers is advisably imaged as an object of an optically reduced image in an image plane on the target for generating an EUV-emitting plasma or on any other work surface (e.g., of a workpiece).

The telescopic system is advisably formed as optics comprising lenses, mirrors or a combination of lenses and mirrors. Aspherical mirror systems or combined lens/mirror systems are advantageously used.

The invention is based on the premise that pulsed laser beams with short pulse lengths and repetition rates in the kilohertz range and high beam quality and average output are needed for certain applications, e.g., for the generation of laser-induced plasmas for EUV projection lithography in semiconductor chip fabrication. This need is met, according to the invention, in that laser pulses originating from a certain number of individual lasers with low repetition frequencies are emitted successively with respect to time. The lasers radiate from different directions on one point of a mirror with changing inclination, preferably of a rotating facet mirror (or polygonal mirror). The rotation of the facet mirror is synchronized with the pulses of the individual lasers in such a way that a facet of the facet mirror having a defined inclination is associated with each laser beam so that the reflected beams are all deflected in the same direction.

The problem in this respect resides in the fast, continuous movement of the mirror during an individual laser pulse, so that there is a "blurring" of the desired target location (point of interaction with the target) after the reflection of the laser light at the associated mirror facet, which reduces the spatial constancy of the laser intensity and the required laser output at the target location. The invention solves this problem by means of an optical system which images the laser spot from the associated mirror surface on the point of interaction with the target in a reduced manner by means of telescopic imaging so that the directional variations of the bundle (due to the mirror movement) are minimized during the laser pulse.

The solution according to the invention makes it possible to generate a laser beam having a high repetition rate and average output which allows the repetition frequency and, therefore, the output of a laser system to be increased by connecting a plurality of lasers with limited repetition rate without degrading the beam quality (stability of intensity and spatial stability) of the laser system at the target relative to that of an individual laser.

The invention will be described more fully in the following with reference to embodiment examples.

DESCRIPTION OF THE PREFERRED EMBODIMENTS

Figure 1:
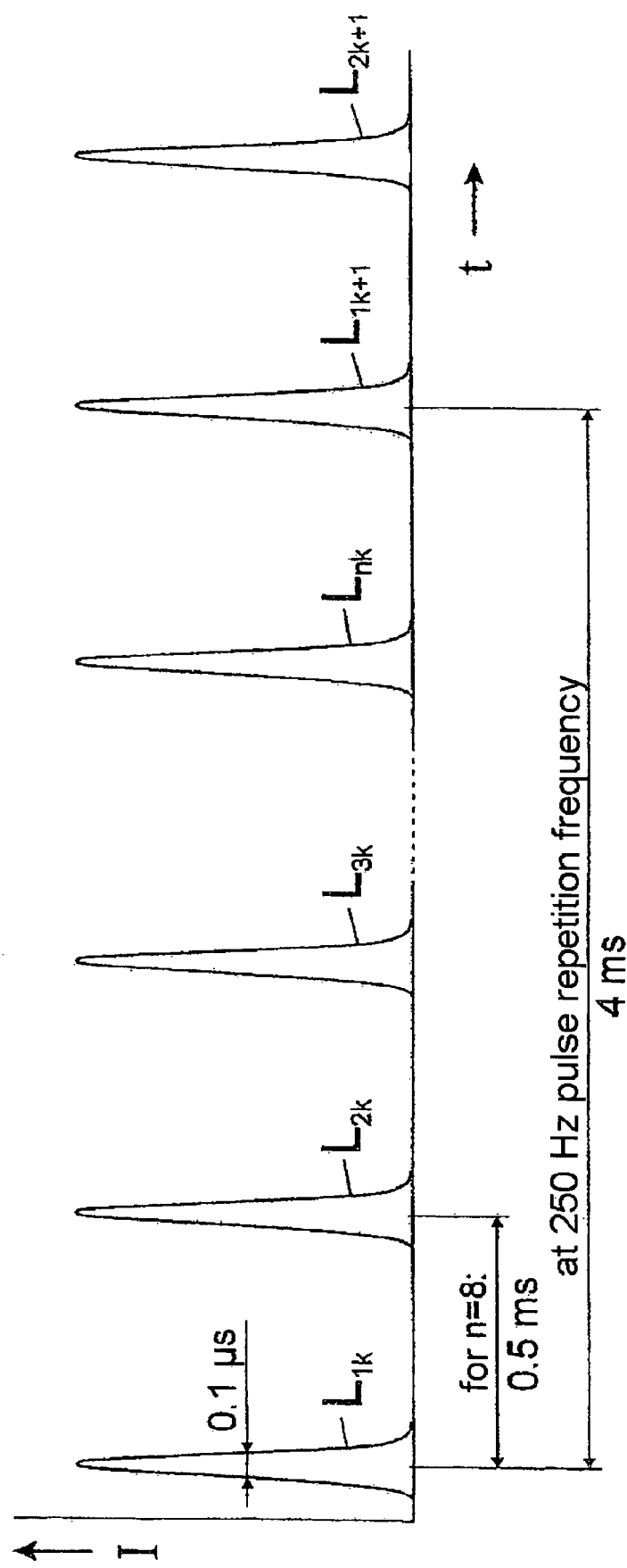
FIG. 1 shows the intensity-time curve of a laser beam that is generated, according to the invention, from successive laser pulses in the common beam path.

FIG. 1 shows the principle of the invention as the output power of a laser system, which has a plurality of laser sources which are directed one after the other to a target, plotted over time. In order to meet the proposed object, namely to achieve an appreciable increase in the repetition frequency of a laser system, the pulsed radiation of different lasers 1 (shown only in the following FIGS. 2, 3 and 4) is linked together in that a plurality of laser pulses $L_1 \ldots L_n$ are coupled into a common beam path 2 (shown only in the following figures) so as to be offset in time (time multiplexing) so that each of the individual lasers $L_1 \ldots L_n$ need only have a low repetition frequency.

With time multiplexing of individual lasers 11, 12, 13, ... 1n, the total output with ideal coupling into the common beam path 2 equals the sum of the outputs of the laser pulses $L_i$ ($L_1, \ldots, L_n$), wherein the beam quality of the laser system is also equal to or virtually equal to the beam quality of every laser pulse $L_1 \ldots L_n$, assuming lasers 1 of identical construction.

The time multiplexing is carried out in that, for the pulse duration of every individual laser 11, 12, ... 1n, a mirror surface 3 has the corresponding angle for the reflection of the associated laser pulse $L_i$ in the common beam path 2 to the target 4. The dynamic adjustment of the mirror surface 3 can be carried out by rotating mirrors or a dynamically operated tilting mirror or oscillating mirror.

The following example is used to illustrate the temporal composition of the pulse sequence of a laser system for any number of lasers in general.

When all of the individual lasers 11, 12, ... 1n oscillate, for example, with a pulse repetition frequency of 250 Hz, i.e., every laser 1 emits a pulse every 4 ms, a defined phase displacement (time delay) of pulse sequences $L_{1k} \ldots L_{nk}$ of the individual lasers 11, 12, ... 1n with respect to one another is required for generating the results according to FIG. 1. The time delay between two individual lasers 1i and 1(i+1) that are coupled in successively should correspond to the time between two laser pulses $L_{ik}$ and $L_{ik+1}$ of an individual laser 1i divided by the quantity n of coupled lasers 1.

With a selected quantity n=8, a time delay of 0.5 ms must be selected, for example, between the laser pulses $L_1 \ldots L_2$ to be coupled. The rest of the laser pulses $L_3 \ldots L_8$ then follow, each with the same time delay. The length of the laser pulses $L_1, \ldots, L_n$ should be substantially shorter than the time delay. The smaller the quantity of mirror surfaces 3 available for time multiplexing, i.e., the higher the rotating speed of the mirror surface(s), the shorter the time delay that must be selected. In the present example, the pulse duration (half width) of every laser 1 is about 100 ns and is accordingly 5000-times shorter than the calculated time delay between two lasers 1 and 1(i+1) that are successively coupled in.

Figure 2:
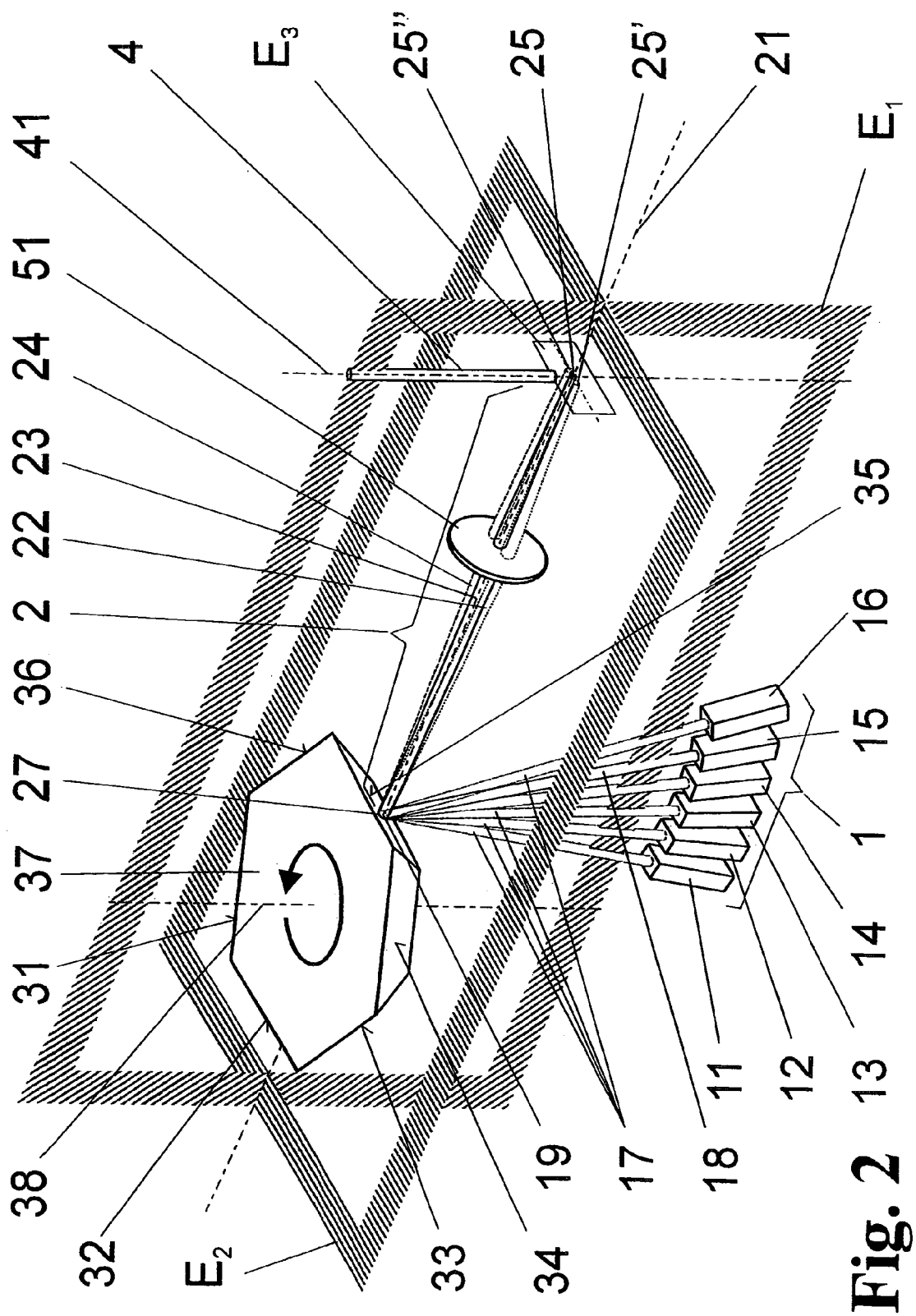
FIG. 2 illustrates the problem of the angular deviation of a laser pulse with continuously rotated facet mirror (polygonal mirror)

FIG. 2 shows a possible realization for coupling six individual lasers 11 to 16 into a common beam path 2, which is directed to a target 4, by means of mirror surfaces 3.

Since intensity-reducing semitransparent mirrors cannot be used for coupling in the individual lasers 11 to 16, it is best to assign at least one suitably inclined mirror surface 3 to each of the individual lasers 11 to 16, which mirror surface 3 is temporarily available in a suitably oriented manner for the duration of the respective laser pulse $L_1$ to $L_n$ for deflecting the beam into the common beam path 2.

A rotatable polygonal mirror or facet mirror 37 proves particularly advisable for the rapid changing of a mirror surface 3 that is individually adjusted to every laser. In general, the number of facets is generally an integral multiple of the quantity n of lasers 1 to be coupled in. In FIG. 2, a one-to-one assignment of the individual lasers 11 to 16 to the mirror facets 31 to 36 was selected for coupling into a common beam path 2. The individual mirror facets 31 to 36 have different inclinations relative to the axis of rotation 38 so that the resulting reflected beams are all collinear. A polygonal mirror with facets having different angular positions is known per se (e.g., from U.S. Pat. No. 5,818,546).

As is shown in FIG. 2, all of the lasers 11 to 16 preferably lie in a laser plane $E_1$ in which the axis of rotation 38 of the facet mirror 37 is also arranged. The laser beams 17 of the individual lasers 11 to 16 which are emitted from different positions are directed to the target 4 by associated mirror facets 31, 32, 33, 34, 35 or 36, respectively, in the common beam path.

When high repetition rates of the laser pulses (>100 Hz) are required in the target plane $E_3$, a mechanically stepped rotation of a facet mirror 37 (or mirror wheel, oscillating mirror, etc.) can no longer be realized in a sensible manner.

However, when the facet mirror 37 moves continuously, the reflection plane of the currently active laser beam 18 for a (randomly selected) individual laser 15 is deflected for the duration of its laser pulse $L_5$ at an angle lying in a normal plane relative to the axis of rotation 38 of the associated mirror facet 35. Accordingly, the laser light that is deflected by the mirror facet 35 not only runs along the optical axis 21 of the common beam path 2, but is deflected for the duration of the pulse by an angle lying in an orthogonal plane $E_2$ relative to the axis of rotation 38 of the mirror facets 31 to 36. (This also applies in an analogous manner to the axis of rotation of an oscillating mirror 39 such as is used in FIG. 5). Therefore, the changes in angle of the active mirror facet 35 for the duration of the laser pulse $L_5$ affect the direction of the reflected laser beam.

This effect is illustrated in FIG. 2 in which three reflected beam bundles 22, 23, 24 are shown schematically in the orthogonal plane $E_2$ which is orthogonal to the axis of rotation 38 and to the laser plane $E_1$. The currently active laser beam 18 of the (randomly selected) individual laser 15 is swiveled by the moving mirror facet 36 for the duration of the pulse. The reflected beam bundles 22, 23 and 24 are shown in this laser beam oscillation as three snapshots of the laser pulse $L_5$ at the beginning, middle, and end of the laser pulse $L_5$. Due to the progressive change in angle of the mirror facet 35, the laser spot 25, which should ideally be focused on the target 4, is "blurred" by the simple focusing optics 51 practically over the target plane $E_3$ from the initial laser spot 25' to the final laser spot 25" and the laser output acting on the target 4 accordingly loses intensity and constancy. Therein lies the real physical problem of the fast time multiplexing of individual lasers 11 to 16 (or, as the case may be, of an even greater quantity of lasers).

Figure 3:
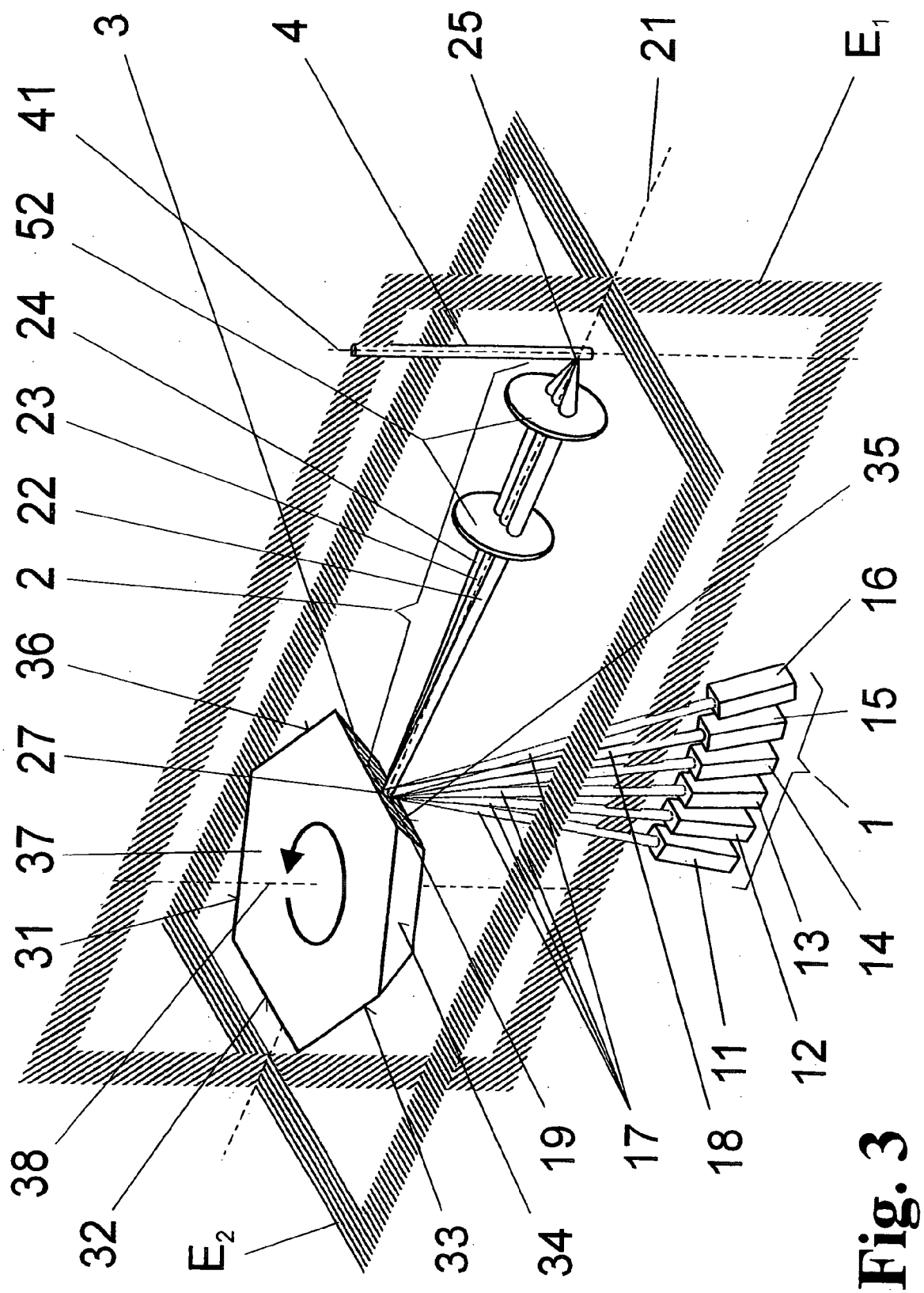
FIG. 3 is a schematic view of the arrangement according to the invention for coupling a plurality of laser pulses into a common beam path by means of a facet mirror which has facet surfaces with different incidence angles and a telescopic imaging system in the common beam path.

Therefore, according to the invention, as is shown in FIG. 3, a telescopic system 52 is used in the common beam path 2 to parallelize the beam bundles 22, 23, 24 of each laser (in the present case, individual laser 15) which are spread out over the pulse duration and focus them on the target 4.

In order to achieve a temporally constant position of the laser spot 25 on the target 4 during the laser pulse $L_5$, the location of the laser spot 27 on the mirror facet 35 is imaged in a reduced and sharp manner on the target 4 (e.g., in order to generate a laser-induced plasma) by means of the telescopic system 52 comprising at least two lenses, so that the schematically shown individual beam bundles 22, 23, 24 of the laser pulse $L_5$ have a common point of intersection in the laser focus 25 in the desired target plane $E_3$. Accordingly, the telescopic lens system 52 compensates for the changes in the reflection direction for the duration of each of the laser pulses $L_1$ to $L_6$ on the path from the associated mirror facets 31 to 36 to the target 4 and the laser spot 25 of each individual laser 11 to 16 is accordingly kept constant with respect to position and laser output in the target plane $E_3$.

In order to configure the laser system, according to the invention, for a repetition frequency to be achieved (in contrast to the example shown in FIG. 3 with a facet mirror 37 with six facets 31 to 36), the quantity n of lasers 1 to be coupled in is subsequently determined in a suitable manner.

The repetition frequency to be achieved should be 2500 Hz. The repetition frequency of an available individual laser $1i$ should be 250 Hz. Accordingly, ten lasers 1 are required for coupling in on the common beam path 2. The lasers 1 are arranged in a manner analogous to FIG. 3 in a laser plane $E_i$ which is defined by the laser beams 17 and 18 and the common beam path 2.

In this case, the facet mirror 37, in accordance with the quantity of lasers (n=10), must have 10·k facets (k=1, 2, . . . ) which have different inclinations depending upon the position of the lasers 1 in order to direct their laser beams 17 and 18 in a common beam path 2 to the target 4 after being reflected at the associated mirror facets.

For k=1, i.e., for ten mirror facets, the necessary rotational speed of the facet mirror 37 is given by the repetition frequency of each laser 1 at 250 R·s$^{-1}$, since the facet mirror 37 must be completely rotated exactly once around its axis of rotation 38 for this purpose in order to have the associated mirror facet (e.g., 35) available again for the next pulse $L_{ik}$ of the same laser (e.g., laser 15). This gives a rate of rotation of 15,000 R·min$^{-1}$ or an angular velocity of $\omega=1570$ s$^{-1}$.

Due to the continuous rotation of the mirror facet 35 around the axis of rotation 38, there is an angular change $\gamma$ of the reflection plane (not shown in the drawings) of the currently active laser beam 18 of $$\gamma = 2\omega \cdot \Delta t$$

during a time interval $\Delta t$. With a given laser pulse duration of about 100 ns, the angular deviation $\gamma$ of the reflected laser light between the beam bundles 22 and 24 is calculated over the entire pulse duration:

$$\gamma(\Delta t = 100 \text{ ns}) = 2 \cdot 1570 s^{-1} \cdot 10^{-7} s$$
$$= 0.3 \text{ mrad}$$

Accordingly, this angular deviation $\gamma$ is small enough so that the reflected laser bundle lies within the aperture of "normal" optics. This means that with a selected laser beam diameter of 20 mm, an expansion (blurring) of the beam diameter of effectively less than 10% is observed at the entrance into a lens having a focal length of 5 m and a diameter of 5 cm as is conventionally used in telescopic systems. The angular deviation of the reflected laser light (between the schematically shown beam bundles 22 and 24) occurring in front of the focusing optics 5 is compensated by the imaging of the laser spot 27 by the mirror surface 3 via a telescopic lens system and mirror system 52 and 53, respectively, in the target plane $E_3$, so that the excitation point (laser focus 25) within the target plane $E_3$ and, therefore, the laser output on the target 4 are kept constant for laser systems with any number of lasers 1.

For the sake of comparison, with simple focusing of the laser beam 18 with only one lens (simple optics 51 according to FIG. 2 or, equivalently, with a concave mirror) having a focal length of 200 mm, a spatial displacement of the laser focus 25 (from laser spot 25' to 25") of 60 μm would result in the target plane $E_3$, which is not permissible with conventional target diameters of about 20 μm.

Figure 4:
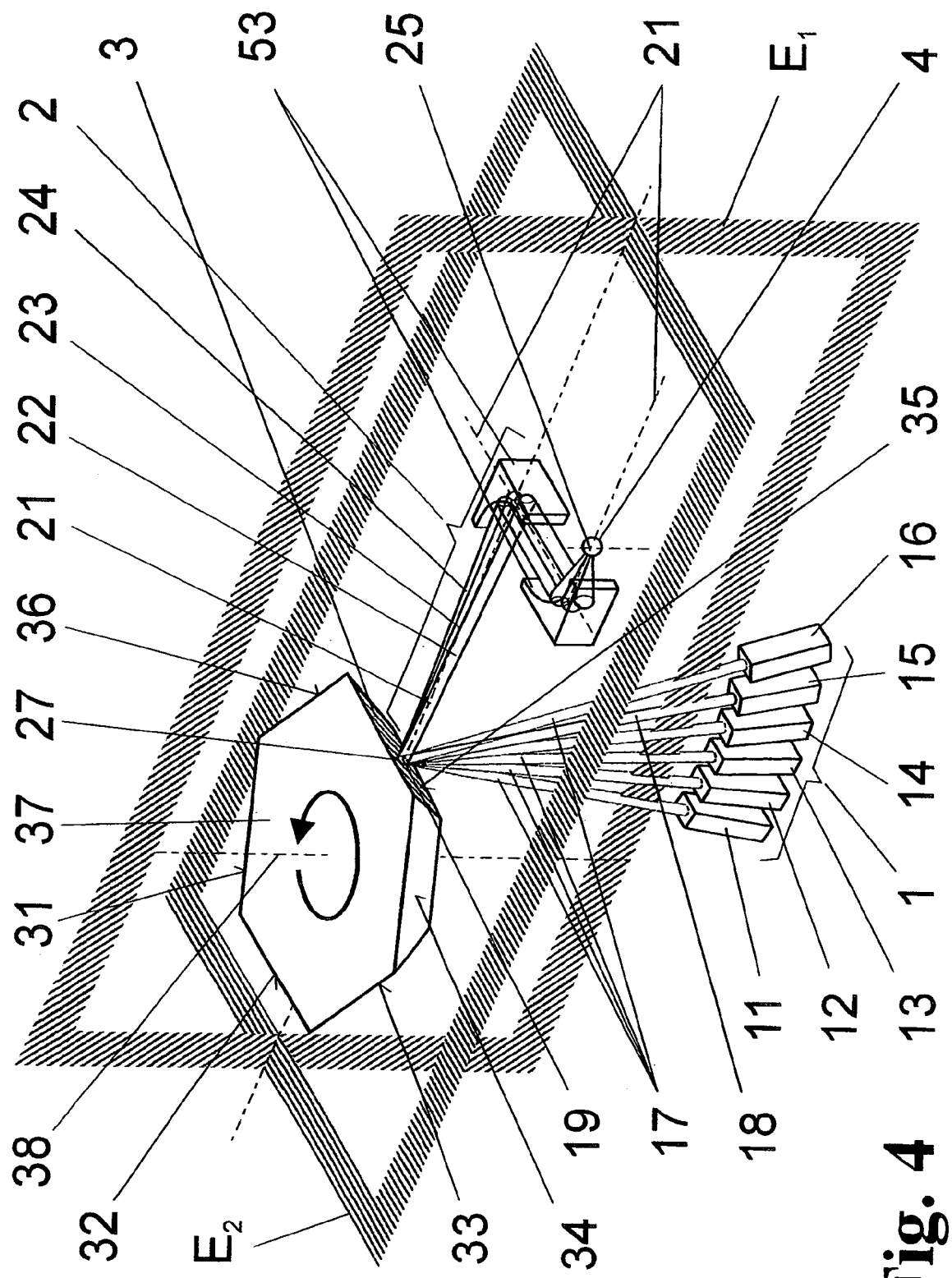
FIG. 4 shows a modified arrangement of the invention in relation to FIG. 3, with a continuously rotated facet mirror and a telescopic mirror system.

The arrangement according to FIG. 4 is modified with respect to the arrangement shown in FIG. 3 in that a telescopic mirror system 53 is added in place of the telescopic lens system 52. The function of the total system for time multiplexing of laser pulses $L_i$ is changed only insofar as the common beam path 2 is bent twice because aspherical mirrors are used. Accordingly, the location of the laser focus 25 typically no longer lies in the same plane as the axis of rotation 38 of the mirror surface 3, and the target 4 (shown here generally as an individual target) is provided outside of the intersecting straight lines of the laser plane $E_1$ and orthogonal plane $E_2$ in a corresponding manner.

Figure 5:
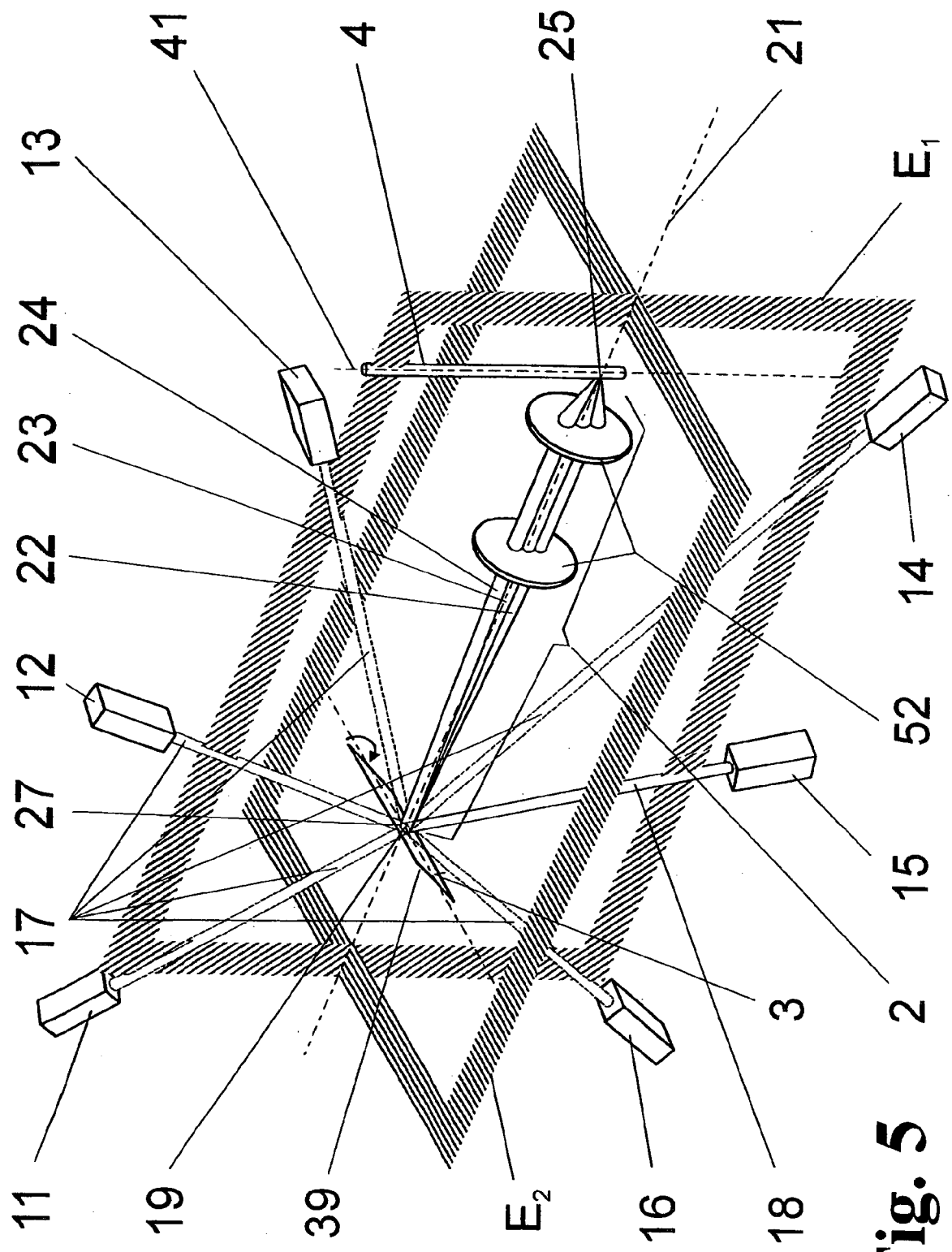
FIG. 5 shows an arrangement of the invention analogous to FIG. 3, but with only one rotating mirror and a telescopic lens system.

FIG. 5 shows a variant of the invention using a single rotating mirror 39 whose mirror surface 3 rotates around an axis that extends orthogonal to the common optical axis 21 as well as orthogonal to the laser beams 17 emitted by the lasers 11 to 16 (generally, lasers $1i$, where i=1, 2, . . . n) through the point of intersection 19 of all laser beams 17.

In the present embodiment example, the rotating mirror 39 moves at a considerable rotational speed and is struck by one of the laser beams 17 in certain angular positions. The n lasers 1 are arranged at uniform angular distances in the laser plane $E_1$; however, the common beam path 2 around the optical axis 21 and the 180-degree position relative to it must be left open.

In this case, the imaging of the respective laser spot 27 on the mirror surface 3 is again carried out by means of a telescopic lens system 52 in order to combine the beam bundles 22 to 24 in the laser spot 25 on the target 4 and accordingly to image the laser spot 27 from the rotating mirror 39 on the target 4 in a reduced manner.

In FIG. 5, the rotating mirror 39 is adjusted with respect to the active laser beam 18 of the laser 15 in just such a way that the continuously ongoing rotational movement of the rotating mirror 39 for the active laser beam 18 results in different snapshots of reflected laser light, three of which are shown at the beginning, middle, and end of the laser pulse in the form of beam bundles 22 to 24 of the reflected laser light.

In this arrangement, the angular deviation y of the reflected beam bundles 22 to 24 extends within the same plane (laser plane $E_1$) and is oriented in the direction of the target axis 41 for this selected instance in which the target 4 is supplied a reproducible manner.

When using an individual rotating mirror 39 as a multiplexer element, the telescopic lens system 52 (or also when the facet mirror 37 is used) can be replaced by a telescopic mirror system 53 (as is shown in FIG. 4) or combined mirror/lens telescopes can be used without departing from the framework of the teaching according to the invention.

While the foregoing description and drawings represent the present invention, it will be obvious to those skilled in the art that various changes may be made therein without departing from the true spirit and scope of the present invention.

REFERENCE NUMBERS 1 laser
11 to 16 individual lasers
$1i$ (any number of) individual lasers
17 emitted laser beams
18 active laser beam
19 intersection
2 common laser beam
21 optical axis
22 to 24 beam bundles
25 laser focus
25', 25" laser spots (in the target plane)
26 "blurred" laser spot (in the target plane)
27 laser spot (on the mirror facet)
3 mirror surface
31 to 36 mirror facets
37 polygonal/facet mirror
38 axis of rotation
39 rotating mirror
4 target
41 target axis
5 focusing optics
51 simple optics
52 telescopic lens system
53 telescopic mirror system
$L_1$ to $L_n$ laser pulses
$L_{ik}$, $L_{ik+1}$ successive laser pulses
$E_1$ laser plane
$E_2$ orthogonal plane
$E_3$ target plane

What is claimed is:

1. An arrangement for generating a pulsed laser beam with high average output, in particular for generating a hot plasma which emits extreme ultraviolet (EUV) radiation, comprising:

a plurality of light sources wherein each one of the plurality of light sources is associated with a corresponding one of a plurality of differently inclined mirror surfaces in order to achieve defined secondary light source images, in such a way that a light beam that is emitted by each of the light sources so as to be offset with respect to time is coupled into a common beam path at the corresponding differently inclined mirror surface as a reflected beam bundle;

said plurality of light sources being pulsed lasers and being triggered differently in such a way that laser pulses of all individual lasers in the common beam path are directed to a target one after the other in a regular, defined pulse sequence;

means for providing a continuously dynamic mirror movement for orienting the mirror surface for coupling the laser pulses of the individual lasers into the common beam path; and optical means being provided in the common beam path for compensating a change in angle of the beam bundles for the duration of each individual laser pulse in order to achieve a temporally and spatially constant beam quality on the target for the duration of every laser pulse wherein a point of intersection of all of the laser beams of the individual lasers is imaged by the optical means as an object of an optically reduced image in an image plane on the target.

2. The arrangement according to claim 1, wherein the individual lasers are arranged in such a way that the emitted laser beams of the individual lasers intersect at a point in which the mirror surface with variable angular position is located in order to deflect every laser beam successively into the common beam path.

3. The arrangement according to claim 2, wherein the mirror surface associated with each individual laser is arranged at a rotating facet mirror, wherein exactly one minor facet with adapted angular position is directed toward each individual laser when the latter emits a laser pulse.

4. The arrangement according to claim 2, wherein the mirror surface associated with each individual laser is arranged at a rotating facet mirror as a mirror facet with different angular positions, wherein at least two different mirror facets with adapted angular position are alternately directed toward each individual laser when this individual laser emits successive laser pulses.

5. The arrangement according to claim 2, wherein the mirror surface associated with each individual laser is an individual mirror surface as rotating mirror, each individual mirror surface being directed in a suitably adjusted manner toward the individual laser that is activated for emitting a laser pulse.

6. The arrangement according to claim 2, wherein the individual lasers are arranged in a plane around the point of intersection of their emitted laser beams.

7. The arrangement according to claim 1, wherein the pulse length of an individual laser is substantially shorter than the time between two successive pulses of different individual lasers, wherein the smaller of the plurality of differently inclined mirror surfaces is available for coupling in the individual lasers, the shorter the pulse length.

8. The arrangement according to claim 1, wherein the individual lasers are TEA-$CO_2$ lasers.

9. The arrangement according to claim 1, wherein the individual lasers are excimer lasers.

10. The arrangement according to claim 1, wherein the individual lasers are pulsed solid state lasers.

11. The arrangement according to claim 1, wherein the individual lasers are arranged as a combination of TEA-$CO_2$ lasers, excimer lasers, or pulsed solid state lasers.

12. The arrangement according to claim 1, wherein the optical means is telescopic system is provided in the common beam path for compensating the directional change of the reflected beam bundles during a laser pulse 13. The arrangement according to claim 12, wherein the point of intersection of all of the laser bundles of the individual lasers is imaged by the telescopic system as an object of an optically reduced image in an image plane on any work surface.

14. The arrangement according to claim 12, wherein the telescopic system (52) is formed of lenses.

15. The arrangement according to claim 12, wherein the telescopic system is formed of curved mirrors.

16. The arrangement according to claim 12, wherein the telescopic system is formed of a combination of lenses and mirrors.

* * * * *